United States Patent [19]

Harvey

[11] Patent Number: 5,793,095

[45] Date of Patent: Aug. 11, 1998

[54] CUSTOM LASER CONDUCTOR LINKAGE FOR INTEGRATED CIRCUITS

[75] Inventor: Ian R. Harvey, Livermore, Calif.

[73] Assignee: VLSI Technology, Inc., San Jose, Calif.

[21] Appl. No.: 697,193

[22] Filed: Aug. 21, 1996

[51] Int. Cl.$^6$ .................................................. H01L 29/00
[52] U.S. Cl. ........................... 257/530; 257/773; 438/131
[58] Field of Search ..................................... 257/530, 773, 257/77 C; 438/131

[56] References Cited

U.S. PATENT DOCUMENTS

| | | | |
|---|---|---|---|
| 3,766,308 | 10/1973 | Loro | 257/530 |
| 4,839,700 | 6/1989 | Ramesham et al. | 257/530 |
| 5,373,379 | 12/1994 | Nakai | 257/530 |
| 5,512,775 | 4/1996 | Cho | 257/773 |

*Primary Examiner*—Jerome Jackson
*Assistant Examiner*—Nathan K. Kelley
*Attorney, Agent, or Firm*—Clifton L. Anderson

[57] ABSTRACT

An integrated circuit includes a substrate with doped regions, a patterned polysilicon layer defining contacts and local interconnects, a submetal dielectric, a two-metal layer metal interconnect structure with an intermetal dielectric layer, and a passivation layer. Like the dielectric layers, the passivation layer is optically transparent, thick, and planarized. Because of this, laser energy can be directed through the passivation layer to fuse two conductors of the top metal layer without delaminating the passivation layer. In addition, laser energy is directed through the passivation layer and the intermetal dielectric to fuse pairs of conductors in the lower metal layer. Thus, the present invention provides for reliable convenient circuit modification without disturbing dielectric and exposing metal features to moisture and other contaminants.

1 Claim, 4 Drawing Sheets

CUSTOM LASER CONDUCTOR LINKAGE FOR INTEGRATED CIRCUITS

BACKGROUND OF THE INVENTION

The present invention relates to integrated circuit technology and, more particularly, to a method for post-manufacturing custom-modification of physically modifying an integrated circuit. A major objective of the present invention is to provide a simple, economical, and reliable method of linking metal conductors of an integrated circuit.

Advances in integrated circuit manufacturing technology have allowed ever increasing functionality to be implemented on a single device. A typical integrated circuit includes: a silicon substrate with regions doped to control their conductivity type, field and gate oxides for electrically isolating the substrate from overlaying conductors, one or more polysilicon layers for forming contacts and local interconnects, a submetal dielectric layer, a metal interconnect structure, and a passivation layer. The metal interconnect structure can have one or more metal layers. Where there are plural metal layers, the layers are separated by intermetal dielectric, usually at least as thick as the underlying metal. In addition, the submetal and intermetal dielectrics are often planarized so that the next metal layer can be formed on a flat surface. The passivation layer tends to be thinner, since it is not required to isolate conductors, and not planarized, since it is not used as a base for subsequently formed features.

As integrated circuit designs have become more complex, it has become increasingly difficult to ensure that a design properly implements all its intended functions. Accordingly, prototypes must be built and tested before a commitment is made to a large volume run. However, small volume prototype runs can be quite expensive and time consuming. If a design defect is found in a prototype, it is desirable to verify the new design prior to starting over to make a new prototype.

One increasingly popular prototyping approach uses electrically (e.g., "field", or "user") programmable devices. The functions performed by such devices are determined after manufacture by electrically programming the device. If defects in the programming of a first device are discovered, a second device can be correctly programmed and substituted for the first device. Even more convenient are electrically reprogrammable devices in which a defective design program can simply be overwritten by a corrected program. However, the variations that can be implemented by programming are limited by the circuit as designed into the programmable device. If the circuitry of the programmable device is defectively designed, the defect cannot in general be corrected by reprogramming the device or by substituting a nominally identical device with different programming. Thus, even with programmable and reprogrammable devices, the problem of correcting defectively designed hard circuitry remains.

In an "antifuse" approach to electrically programming a circuit, a large voltage differential is applied across two adjacent conductors (on the same or different layers) so that the intervening dielectric breaks down, thus creating a link. A problem with the antifuse approach is that the resulting link has a relatively high impedance, so large currents, e.g., driver currents, cannot be handled. Furthermore, the antifuse approach is limited to creating links, whereas it is desirable to be able to create reliable opens along existing conductors as well.

It is also possible to physically modify an integrated circuit to create an open. For example, a laser can be used to cut a conductor to create an open. However, the laser energy will disrupt the overlaying dielectric, impairing the predictability of the modification as well as the long-term reliability performance of the circuit.

Focused ion beam systems have been used to make connections as well as break them. A focused, rasterized beam of high-energy ions, e.g., gallium ions, can be used to sputter and remove dielectric over metal lines. If a break is desired, the beam can be used to precisely cut through the metal. If a new connection is desired between thus exposed conductors, the metal itself is left undisturbed; metal-bearing, e.g., tungsten carbonyl, gas is admitted into the vacuum chamber. The ion beam is scanned from one metal electrical node to the other. The ion beam locally decomposes the metal-bearing gas adsorbed onto the surface, leaving a conductive trace between the metal electrical nodes. This technique is very flexible, permitting connections even between nodes that are on the same or different metal interconnect levels and disposed far apart on the integrated circuit.

The main advantage of the focused ion beam approach is that it allows flexible modification of an integrated circuit, both before and after integrated circuit manufacture is completed. The focused ion beam approach is costly in that the equipment is expensive and requires a high degree of skill on the part of the operator. If circuit breaks are required in isolated lines, the laser cutting approach is most cost effective. However, as with laser cutting, the focused ion beam damages intermetal and passivation dielectric, the effects of which can be difficult to predict and control. Accordingly, devices so modified are best limited to design verification purposes; newly designed and manufactured devices are still required for end uses.

What is needed is an improved method of modifying integrated circuits. It should provide for making connections as well as breaking them. Yet, the method should be more economical and less destructive than the focused ion beam method.

SUMMARY OF THE INVENTION

In accordance with the present invention, a laser beam is directed through an intact dielectric to link two metal conductors of an integrated circuit. The minimum dielectric thickness above the conductors is greater than, and is preferably at least twice, the maximum thickness of the conductors in order to maintain mechanical integrity during the procedure. The conductors are preferably spaced a distance less than twice their maximum thickness.

The wavelength of the laser is selected so that it is absorbed much better by the metal than by the dielectric material. For dielectrics and metals commonly used in integrated circuits, visible light lasers of sufficient power tend to be suitable. In practice, the method involves placing the integrated circuit (which may still be on a wafer or already mounted in a package) under a microscope. Using a target light to illuminate an area covering the two metal features to be linked and then pulsing the laser. The selected laser power is sufficient to fuse the metals so that they flow into contact, but insufficient to delaminate or ablate the overlaying dielectric.

The thickness of the overlaying dielectric is selected to provide the strength required to resist stress caused by the laser and subsequent deformation of the underlying metal. The required thickness is conventionally achieved in integrated circuits with multi-layer metal interconnect structures, as long as the conductors to be linked are on a metal layer other than the top metal layer. Accordingly, the method can be applied to many integrated circuits designed without the present invention in mind. However, a much greater range of electrical modifications can be provided for if the integrated circuit is designed with consideration given to subsequent laser linking of conductors.

Accordingly, an integrated circuit can be manufactured so that the passivation layer over the top metal layer has a minimum thickness at least as great, and preferably at least twice as great, as the metal conductor thickness. In addition, the passivation layer can be planarized to optimize its optical transmission characteristics and improve the efficiency of laser energy delivery to the conductors. In this case, the passivation layer can be similar to conventional intermetal dielectric layers. However, the purpose of the structure is different since the thickness is not required for electrical insulation or for forming structures thereon. The invention thus provides for the pre-linking integrated circuit structure, as well as such structures in which laser linking of conductors has taken place.

In addition, the metal patterns can be designed for optimal laser fusion. Accordingly, unoccluded corners can be provided for pairs of conductors for optional connection. The mechanical stresses associated with such corners serve as relatively predictable material transfer sites. In addition, corners have a greater reservoir of material for forming the link. Alternatively, conductors to be fused can be made wider than other conductors to provide that extra reservoir for connection by this method.

The laser fusion method is less flexible than the focused ion beam in that the metal features to be linked must be close together and on the same metal layer. On the other hand, the equipment required for laser linking can cost an order of magnitude less than the equipment required for the focused ion beam method. Little training is required to operate the laser and there is no vacuum requirement. In the laser linkage approach, passivation and dielectric material is left in place; therefore exposure to moisture is minimized and no additional passivation steps are required to ensure long-term device reliability.

Because of these advantages, the laser fusion approach is practical not only for prototype modification but also for field programmability. In fact, integrated circuits can be designed with certain conductors adjacent to each other to permit their linking to implement predetermined functions. This laser linking method can be used instead of or in addition to other methods for modifying circuits as described above. These and other features and advantages of the invention are apparent from the description below, with reference to the following drawings.

BRIEF DESCRIPTION OF THE DRAWINGS

FIG. 3 is a plan view of a pair of layers of an integrated circuit modified in accordance with the present invention.

DESCRIPTION OF THE PREFERRED EMBODIMENTS

Figure 1:
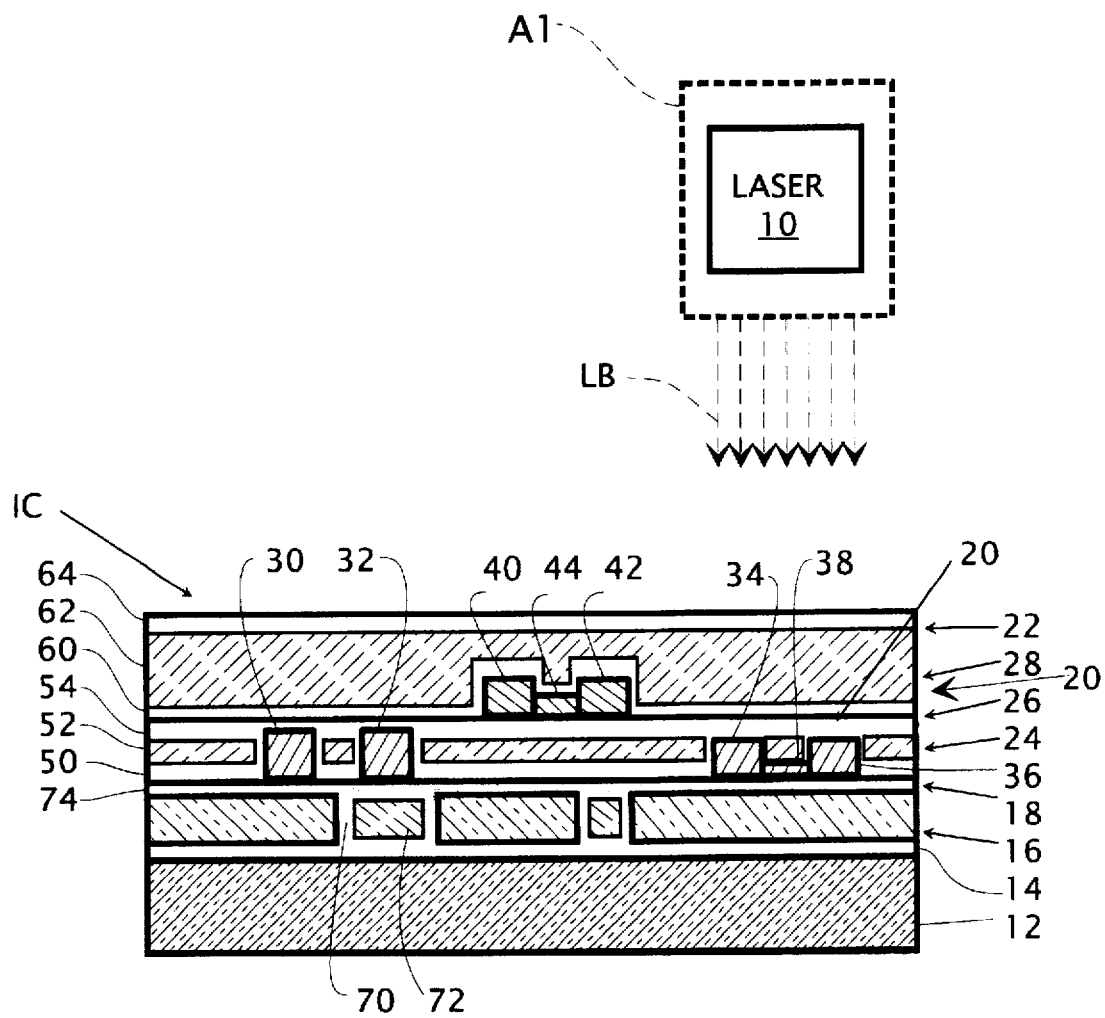
FIG. 1 is a schematic illustration of a integrated circuit in accordance with the present invention and a system for modifying the integrated circuit.

In accordance with the present invention, a system A1 for modifying an integrated circuit IC includes a laser 10 for fusing together adjacent conductors of the integrated circuit. Integrated circuit IC includes a substrate 12, gate and field oxides 14, a polysilicon layer 16, a submetal dielectric layer 18, a metal interconnect structure 20, and a passivation layer 22, as shown in FIG. 1. Metal interconnect structure 20 includes a lower metal layer 24, an intermetal dielectric layer 26, and an upper metal layer 28.

Lower metal layer 22 includes four conductors 30, 32, 34, and 36. In accordance with the present invention, adjacent conductors 34 and 36 are being fused by laser beam LB from laser 10 to form a link 38. Adjacent conductors 30 and 32 are shown prior to fusion. Upper metal layer 28 includes adjacent conductors 40 and 42, which have been laser fused in accordance with the invention to form link 44.

Intermetal dielectric layer 26 conventionally includes three sublayers: a lower silicon dioxide sublayer 50, a spin-on glass (SOG) sublayer 52, and an upper silicon dioxide sublayer 54. Upper silicon dioxide sublayer 54 provides electrical isolation between upper metal layer conductors, e.g., 40 and 42, and lower metal layer conductors, e.g., 30, 32, 34, and 36. It is polished back to provide a flat surface on which to form upper metal layer conductors, e.g., 40 and 42. SOG sublayer 52 fills in interstices between lower metal layer conductors to provide a more planar surface on which to deposit upper silicon dioxide layer 54. Lower silicon dioxide sublayer 50 provides for better adhesion and conformity of SOG sublayer 52. Lower metal dioxide sublayer 50 and SOG sublayer 52 are etched back to expose lower metal layer conductors, e.g., 30, 32, 34, and 36, prior to deposition of upper metal layer 26. Upper metal layer conductors, e.g., 40 and 42, are electrically connected to lower metal layer conductors, e.g., 30, 32, 34, and 36 by metal vias (not shown) through intermetal dielectric layer 26.

Also in accordance with the present invention, passivation layer 22 includes three sublayers, a lower silicon dioxide sublayer 60, a spin-on glass (SOG) sublayer 62, and an upper silicon dioxide sublayer 64. Lower silicon dioxide sublayer 60 provides better adhesion and conformity for SOG sublayer 62. SOG sublayer 62 fills in interstices between conductors of upper metal layer 28 to provide a smoother surface on which to deposit upper silicon dioxide layer 64. In addition, SOG sublayer 62 contributes additional thickness over upper metal layer conductors. Upper silicon dioxide layer 64 provides the final passivation for integrated circuit IC. It is polished flat to provide favorable optical conditions for laser transmission in accordance with the present invention.

Passivation layer 22 differs from conventional passivation layers in being thick and planarized. A more typical passivation layer comprises thin nonplanar sublayers of silicon dioxide and silicon nitride. The present invention provides a thicker passivation layer to provide the mechanical strength required to withstand stresses induced by laser fusion of upper metal layer conductors. The present invention provides for a planar passivation layer to optimize energy transfer at the air/oxide interface at the top of passivation layer 22.

Thus, passivation layer 22 is more similar to intermetal dielectric layer 26 than to a conventional passivation layer. Passivation layer 22 differs from intermetal dielectric layer 26 in that lower silicon dioxide sublayer 60 and SOG sublayer 62 are etched back only to the extent required to promote adhesion. In the case of intermetal dielectric layer 26, the etch back is required to ensure that metal conductors and vias do not come in contact with SOG, which can poison the metal. In the case of passivation layer 22, lower silicon dioxide sublayer 60 isolates upper metal layer conductors from SOG sublayer 62 and no vias are formed through passivation layer 22 so poisoning is not a concern.

Substrate 12 is of silicon; various regions of silicon substrate 12 are doped with impurities to define electrically active CMOS circuit elements, e.g., sources, drains, and channels. Polysilicon layer 16 defines gates and local interconnects; these are respectively electrically isolated from substrate 12 by gate and field oxides 14. Polysilicon layer 16 is electrically isolated from metal interconnect structure 20 by submetal dielectric layer 18.

Submetal dielectric layer 18 comprises three sublayers, a lower silicon dioxide sublayer 70, a reflowable glass planarizing sublayer 72, and an upper silicon dioxide sublayer 74. Upper silicon dioxide sublayer 74 provides the primary isolation between polysilicon layer 16 and metal interconnect structure 20. To provide a flat surface on which to form metal interconnect structure 20, upper silicon dioxide sublayer 74 is mechanically polished to a flat surface.

Reflowable glass sublayer 72 is deposited and reflowed. The result is a relatively smooth base for upper silicon dioxide sublayer 74. Lower silicon dioxide sublayer 70 serves to provide enhanced conformity and adhesion for reflowable glass sublayer 72. Note that submetal dielectric layer 18 is similar to intermetal dielectric layer 26 except that reflowed glass is used instead of SOG to fill in interstices between conductors. Lower metal layer conductors, e.g., 30, 32, 34, and 36, are connected to active circuit elements of substrate 12 and to gate contacts and local interconnects of polysilicon layer 16 by metal vias (not shown) through submetal dielectric 18.

Figure 2:
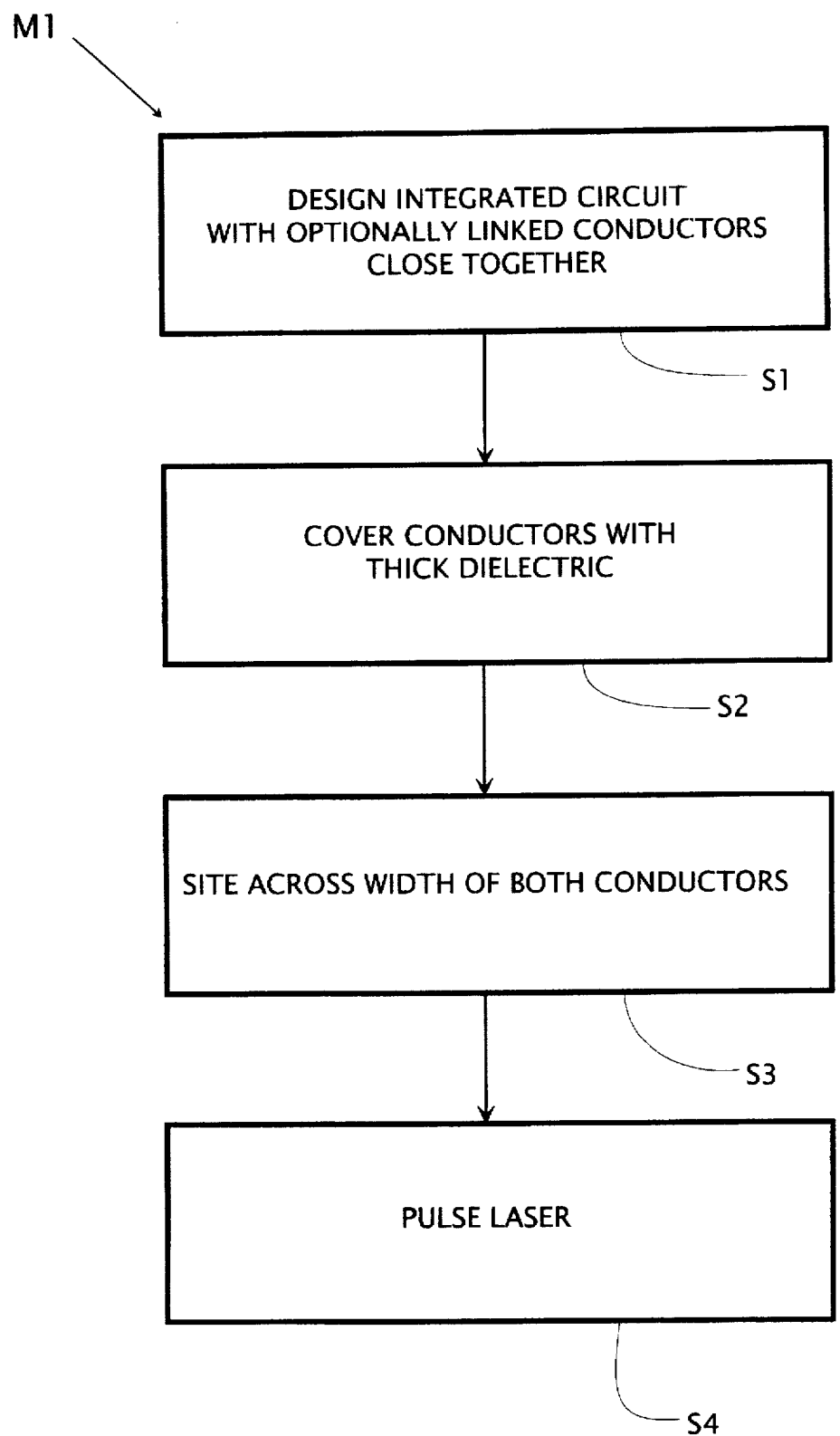
Figure 3:
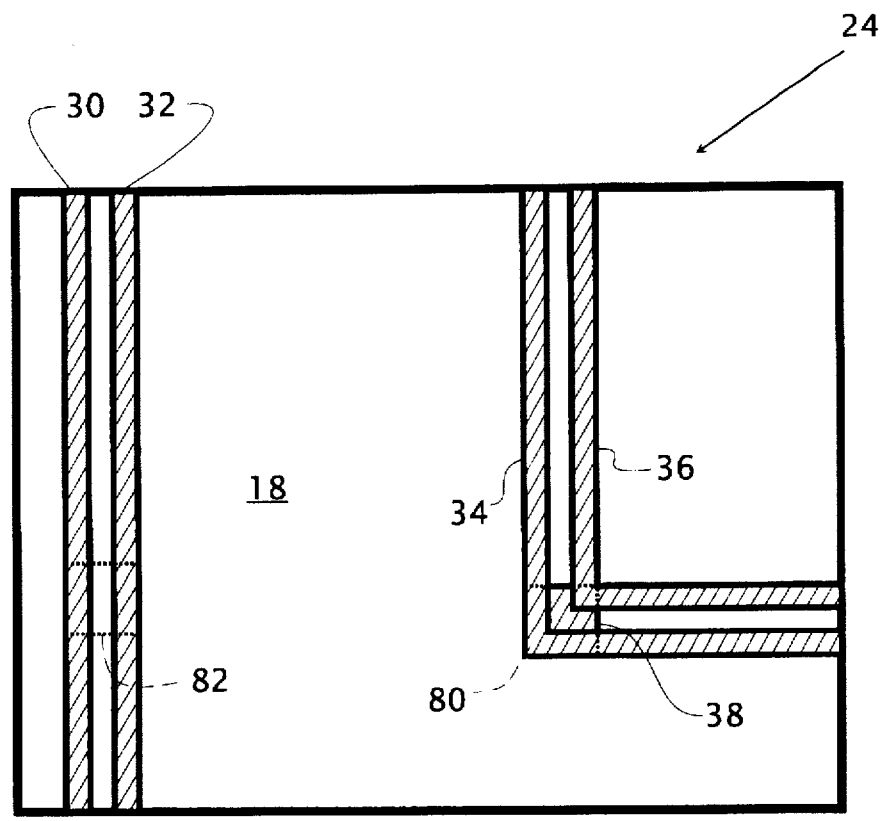
FIG. 3 is a flow chart of a method in accordance with the invention for making the integrated circuit of FIG. 1.

A method M1 for forming links such as links 38 and 44 is flow charted in FIG. 2. It consists of forming an integrated circuit with "linkable" conductors to be optionally shorted disposed adjacent to each other on the same metal layer, at step S1. The metal layer having the linkable conductors is then covered with dielectric thick enough to provide the mechanical strength required to maintain dielectric integrity in spite of the stresses imposed by laser linkage of the conductors, at step S2. Target illumination can be used to site across the width of both conductors, at step S3. The target area 80 used for forming link 38 is shown in FIG. 3; likewise, a target area 82 is shown for use in forming a link between conductors 30 and 32. Laser 10 is then pulsed with sufficient power to fuse and link the conductors while leaving the overlaying dielectric intact, at step S4 of FIG. 2.

Figure 4:
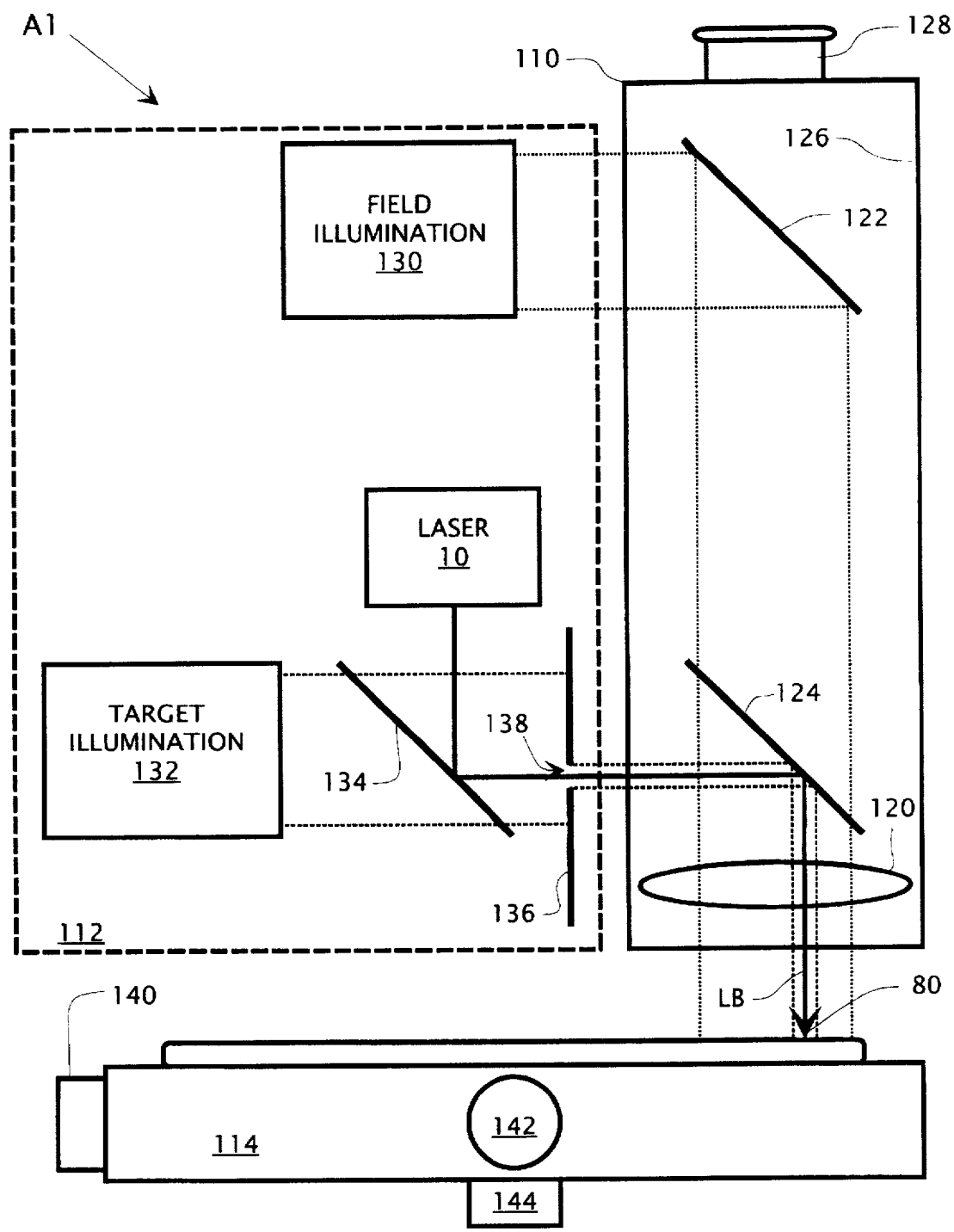
FIG. 4 is a more detailed schematic illustration of the system of FIG. 1.

Integrated circuit modification system A1 for practicing method M1 comprises a microscope 110, an illumination subsystem 112, and a stage 114, as shown in FIG. 4. Microscope 110 includes compound microscope optics 120, schematically represented by a single lens in FIG. 4, beam splitting mirror 122 to deflect field illumination onto integrated circuit IC, beam splitting mirror 124 to deflect target illumination and laser energy to a selected target area of integrated circuit IC, shielding 126 to exclude unwanted light from the optical path of microscope 110, and an eyepiece 128 to permit a human to view that portion of integrated circuit IC within the field of view of microscope 110. FIG. 3 represents that portion of lower metal layer 24 with the field of view of microscope 110. Optics 120 is adjustable so that the area of the portion of integrated circuit IC within the field of view can be selected.

Illumination subsystem 112 includes a field illumination source 130, a target illumination source 132, laser 10, a beam splitting mirror 134, and an aperture 136. Field illumination source 130 provides light to microscope 110. Beam splitting mirror 122 deflects a portion of the field illumination along the optical axis of microscope 110 to integrated circuit IC. Some of the field illumination incident to integrated circuit IC is reflected back along the optical path of microscope 110. A portion of this reflection is transmitted by beam splitting mirrors 124 and 122 through eyepiece 128, enhancing the viewability of integrated circuit IC.

Target illumination source 132 provides target illumination to delimit and highlight a region of integrated circuit IC to be fused by a laser pulse. A portion of the light from target illumination source 132 passes through beam splitting mirror 134 and is shaped by aperture 136 to provide the desired target illumination cross section at integrated circuit IC. The shaped target illumination beam is reflected toward a target region, e.g., 80, of integrated circuit IC by beam splitting mirror 124. A portion of the target illumination reflected by the target region is transmitted through beam splitting mirrors 122 and 124 to eyepiece 128. The target illumination is bright compared to the field illumination so that the target region is highlighted relative to the rest of integrated circuit IC in the field of view of microscope 110 in the image presented at eyepiece 128 to a human viewer.

Aperture 136 is adjustable so that the area of the target illumination cross section can be matched to the area into which laser energy is to be delivered. Preferably, the width of the target illumination beam at integrated circuit IC matches the combined (outer edge to outer edge) width of the conductors to be linked, as indicated by target areas 80 and 82 in FIG. 3. Aperture 136 can be moved so that the target illumination can be moved to different positions within the field of view of microscope 110.

Laser beam LB from laser 10 is reflected by beam splitting mirror 134 toward aperture 136. Aperture 136 shapes laser beam LB, just as it shapes the target illumination so that the area exposed to laser energy matches that delimited by the target illumination. The spatially filtered laser beam LB is reflected toward the target region by beam-splitting mirror 124. The laser energy fuses both conductors 34 and 36 in the target region so that metal flows between them, forming link 38. In the process, the intermetal dielectric layer 26 is stressed, but retains its integrity.

Stage 114 supports integrated circuit IC and provides for three dimensions of movement: control 140 provides for movement in an x dimension, control 142 provides for movement in a y dimension, and control 144 provides for movement in a z dimension, orthogonal to the optical axis of microscope 110. Microscope 110 also provides for three dimensions of movement relative to stage 110. Movement in the x and y dimensions is used to move the microscope field of view relative to integrated circuit IC. The area subtended by the microscope field of view can be determined by adjusting the magnification of microscope 110. Movement in the z dimension is used to provide appropriate clearance of an integrated circuit to be prepared. For example, while integrated circuit IC is still in wafer form, system A1 can be used to modify an integrated circuit already mounted in a package. Microscope 110 and stage 114 can be separated by z dimension movement to clear the package. Preferably, microscope 110 provides a long focal length to focus laser energy on a packaged integrated circuit.

One consideration in the design of integrated circuit IC is the stress induced by absorbed laser energy within the overlaying dielectric material. The heat generated by the laser and the deformation of the underlying metal structure can impose mechanical stress in the dielectric. The dielectric must have sufficient mechanical strength to prevent delamination due to this stress. It is estimated that the dielectric thickness over a fused metal area should be at least twice the prefused metal thickness to ensure dielectric integrity after fusion.

Conventional integrated circuits employ a passivation layer over a top metal layer. The passivation layer typically includes a silicon dioxide sublayer and a silicon nitride sublayer, and constitutes an effective shield against moisture and other contaminants. However, such a passivation layer tends to be no thicker than the underlying metal layer. Hence, there can be a risk of delamination if an attempt is made to layer fuse conductors in the top metal layer. However, if there is more than one metal layer, conductors below the top metal layer can be fused with little risk of delamination.

To maximize post-manufacturing flexibility, step S2 of method M1, FIG. 2, involves designing integrated circuit IC with thick passivation layer 22 so that top metal layer 26 can be modified without risking delamination. In addition, passivation layer 22 is planarized to improve its optical transmission characteristics. In other words, the orthogonality of the target illumination and laser beam LB to the top surface of integrated circuit IC can be achieved most readily with a planar passivation layer 22.

Step S3 involves selecting the target area for fusion. This step involves placing integrated circuit IC on stage 114. Stage 114 is then moved until the target area is within the field of view of microscope 110. Aperture 136 is then set so that the desired target area is highlighted by target illumination.

At step S4, laser 10 is pulsed so as to fuse the conductors in the target area. The laser power and the pulse duration are selected so that sufficient energy is provided to fuse the conductors and so that the overlaying dielectric is not unduly stressed. The precise power and duration should be calibrated for a particular laser and optical train (in the microscope). In general, however, the energy required to delaminate a sufficiently thick dielectric will also splatter the metal so that either a short is not formed or a short that forms is not reliable. Thus, selecting a laser power and a pulse duration for optimal fusing would generally avoid delamination. In the present case, laser 10 delivers 1 millijoule for 5 µS to target area 80, which is about 5µ square.

In integrated circuit IC, thick, planarized passivation layer 22 is optimized for practicing the present invention. Alternatively, a non-planarized passivation layer can be used. Other embodiments use a thin passivation layer, such as a convention oxide/nitride combination. In this case, it is preferable to limit the method to fusing conductors in metal layers below the top metal layer.

While in the preferred embodiment, only links are formed, the present invention can be used to create opens in conductors. The target area can be centered on a single conductor in a region of an integrated circuit in which the distance of the nearest other conductor on the same layer is at least twice the conductor thickness. The laser energy should be the minimum required to create the open to maintain dielectric integrity. This can be accomplished by using the power suitable for forming links; using only as many pulses as required to create the open.

While the present invention has clear advantages over known methods of modifying integrated circuits, it has its own limitations in flexibility. However, when combined with other methods, it provides a greater degree of modification flexibility than has been heretofore achieved. For example, links between layers can be achieved using the anti-fuse approach; but the resulting connection has less current-carrying capacity than the laser link approach of the present invention.

In addition, the present invention can be combined with focused ion beam techniques so that remote links can be formed. In this case, the laser link approach can reduce the number of connections that required the FIB technique, or laser linking can be used in conjunction with focused ion beam milling for device modification. Finally, the invention further provides for a variety of stages, microscopes, illumination systems and laser systems. In the latter case, a wide range of wavelengths can be used that are more readily absorbed by the metal than by the dielectric. These and other variations upon and modifications to the preferred embodiments are provided for by the present invention, the scope of which is limited only by the following claims.

What is claimed is:
1. An integrated circuit structure comprising:
   a substrate;
   a submetal dielectric formed over said substrate;
   a metal interconnect structure formed over said submetal dielectric, said metal interconnect structure including at least two metal layers with a top metal layer having at least two conductors, said conductors having a maximum metal thickness, said conductors being spaced apart by less than said maximum metal thickness, said conductors being fused so that they are shorted; and
   a passivation layer formed over said metal interconnect structure, said passivation layer having a minimum passivation thickness greater than said maximum metal thickness.

* * * * *